United States Patent
Koga et al.

(10) Patent No.: US 6,845,055 B1
(45) Date of Patent: Jan. 18, 2005

(54) SEMICONDUCTOR MEMORY CAPABLE OF TRANSITIONING FROM A POWER-DOWN STATE IN A SYNCHRONOUS MODE TO A STANDBY STATE IN AN ASYNCHRONOUS MODE WITHOUT SETTING BY A CONTROL REGISTER

(75) Inventors: Toru Koga, Kawasaki (JP); Tomohiro Kawakubo, Kawasaki (JP); Tatsuya Kanda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/866,995

(22) Filed: Jun. 15, 2004

(30) Foreign Application Priority Data

Nov. 6, 2003 (JP) ........................................ 2003-376736

(51) Int. Cl.[7] ................................................ G11C 5/14
(52) U.S. Cl. ...................... 365/229; 365/228; 365/227; 365/233; 365/230.08
(58) Field of Search ................................ 365/233, 226, 365/227, 228, 229, 230.08

(56) References Cited

U.S. PATENT DOCUMENTS 6,088,290 A * 7/2000 Ohtake et al. .............. 365/233
6,259,291 B1 * 7/2001 Huang ......................... 327/160
6,466,075 B2 * 10/2002 Douchi et al. ............... 327/296
6,477,108 B2 * 11/2002 Arimoto et al. ............. 365/233
6,608,795 B2 * 8/2003 Arimoto et al. ........ 365/230.03
6,650,594 B1 * 11/2003 Lee et al. .................... 365/233

FOREIGN PATENT DOCUMENTS

JP 2003-162895 6/2003 ......... G11C/11/407

* cited by examiner

Primary Examiner—Andrew Q. Tran
(74) Attorney, Agent, or Firm—Arent Fox, PLLC (57) ABSTRACT

A semiconductor memory that can make the transition from a power-down state in a synchronous mode to an asynchronous mode without setting by a control register and that needs no extra circuits. A state selection section chooses, by selecting an existing internal signal the level of which changes in the power-down state or an existing internal signal the level of which does not change in the power-down state in accordance with a state selection signal inputted in advance and passing a signal selected to a synchronous/asynchronous mode setting section, whether the semiconductor memory should make the transition from the power-down state to a standby state in the synchronous mode or a standby state in the asynchronous mode. In accordance with the selection by the state selection section, the synchronous/asynchronous mode setting section generates a signal for causing the semiconductor memory to make the transition between the synchronous mode and the asynchronous mode.

6 Claims, 7 Drawing Sheets

SEMICONDUCTOR MEMORY CAPABLE OF TRANSITIONING FROM A POWER-DOWN STATE IN A SYNCHRONOUS MODE TO A STANDBY STATE IN AN ASYNCHRONOUS MODE WITHOUT SETTING BY A CONTROL REGISTER

CROSS-REFERENCE TO RELATED APPLICATIONS

This application is based upon and claims the benefits of priority from the prior Japanese Patent Application No. 2003-376736, filed on Nov. 6, 2003, the entire contents of which are incorporated herein by reference.

BACKGROUND OF THE INVENTION (1) Field of the Invention

This invention relates to a semiconductor memory and, more particularly, to a semiconductor memory having a synchronous or asynchronous operation mode for an external clock.

(2) Description of the Related Art

To reduce the power consumption of a semiconductor memory, such as a dynamic random access memory (DRAM), including an internal (step-up or step-down) power supply circuit for generating internal power supply voltage, the internal power supply circuit has traditionally been controlled optimally according to the operating state of the semiconductor memory.

To be concrete, a step-up potential detection circuit activated continuously or at activation time is located for making a step-up circuit for raising the voltage of a word line operate optimally in the active or standby state of the semiconductor memory.

With recent portable devices, a further reduction in power consumption is required. A semiconductor memory having not only the above operation mode but also a power-down mode in which the generation of internal power supply voltage by an internal power supply circuit is stopped for reducing power consumption is disclosed (see, for example, Japanese Unexamined Patent Publication No. 2003-162895).

In addition, to increase efficiency in data transfer, a synchronous mode in which data synchronizes with an external clock is required. Therefore, there is great necessity for the development of a semiconductor memory having a power-down mode, a synchronous mode, and an asynchronous mode as operation modes.

Figure 6:
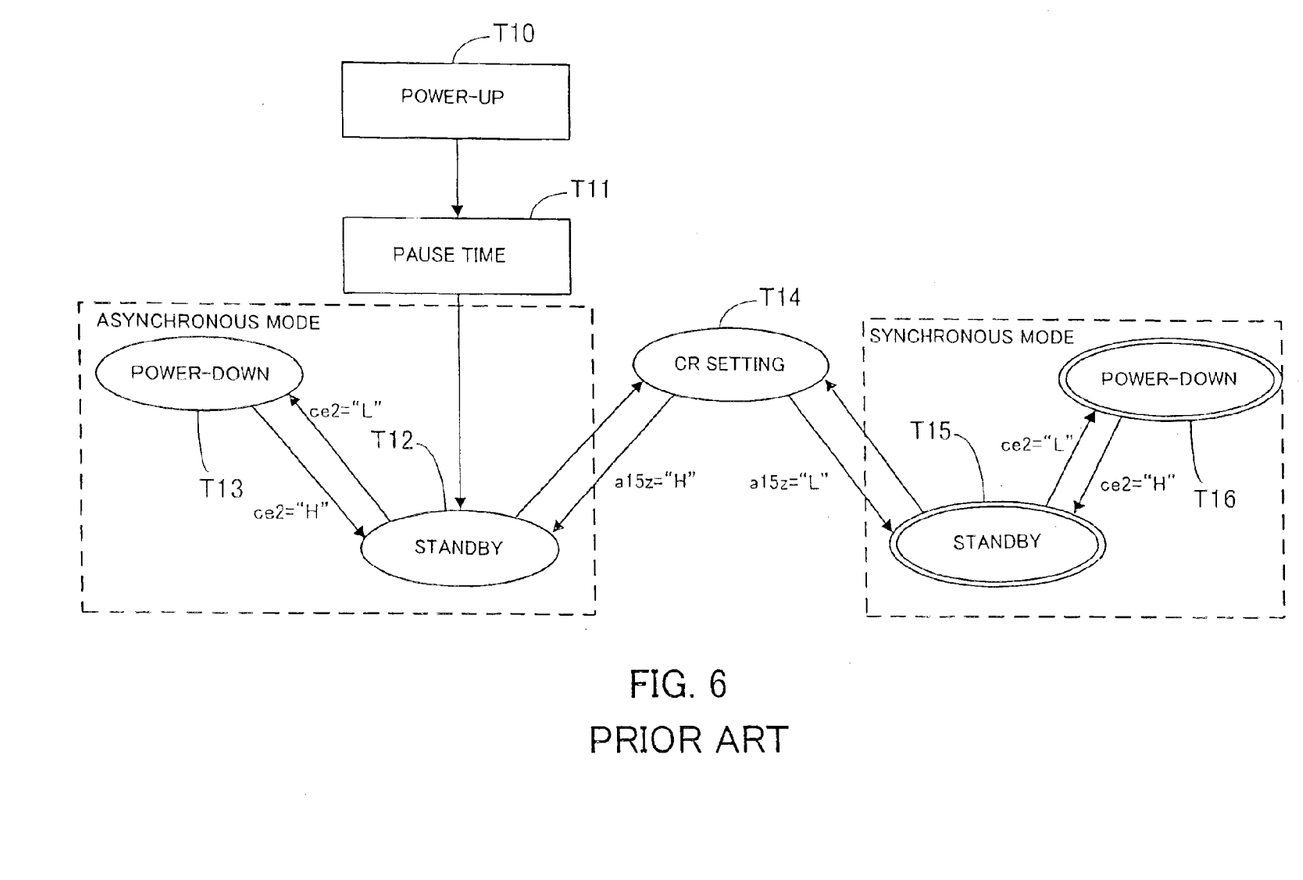
FIG. 6 is a state transition diagram of a semiconductor memory having a power-down state and synchronous and asynchronous operation modes for an external clock.

FIG. 6 is a state transition diagram of a semiconductor memory having a power-down state and synchronous and asynchronous operation modes for an external clock.

As shown in FIG. 6, when external power supply voltage is applied to a semiconductor memory (power-up state T10), the semiconductor memory goes into a standby state T12 in an asynchronous mode after the elapse of pause time T11.

The semiconductor memory makes the transition from the standby state T12 to a power-down state T13 in the asynchronous mode by making a transition signal ce2 inputted from a chip enable terminal CE2 (CE2 terminal) described later low potential ("L" or "L" level). As is not shown, the semiconductor memory can make the transition from the standby state T12 to an active state in the asynchronous mode (asynchronous operation, such as read, write, or erase).

Moreover, the semiconductor memory can make the transition (return) from the power-down state T13 in the asynchronous mode to the standby state T12 in the asynchronous mode by making the transition signal ce2 high potential ("H" or "E" level).

When a synchronous mode is set in the standby state T12 in the asynchronous mode by making a signal a15z, being one of CR setting commands described later, "H" (control register (CR) setting state T14 to the synchronous mode), the semiconductor memory makes the transition to a standby state T15 in the synchronous mode. On the other hand, when an asynchronous mode is set in the standby state T15 in the synchronous mode by making the signal a15z "L" (CR setting state T14 to the asynchronous mode), the semiconductor memory makes the transition to the standby state T12 in the asynchronous mode.

By making the transition signal ce2 "L," the semiconductor memory makes the transition from the standby state T15 in the synchronous mode to a power-down state T16 in the synchronous mode. As is not shown, the semiconductor memory can make the transition from the standby state T15 to an active state in the synchronous mode (synchronous operation, such as read, write, or erase).

By making the transition signal ce2 "H," the semiconductor memory can make the transition from the power-down state T16 in the synchronous mode to the standby state T15 in the synchronous mode.

Figure 7:
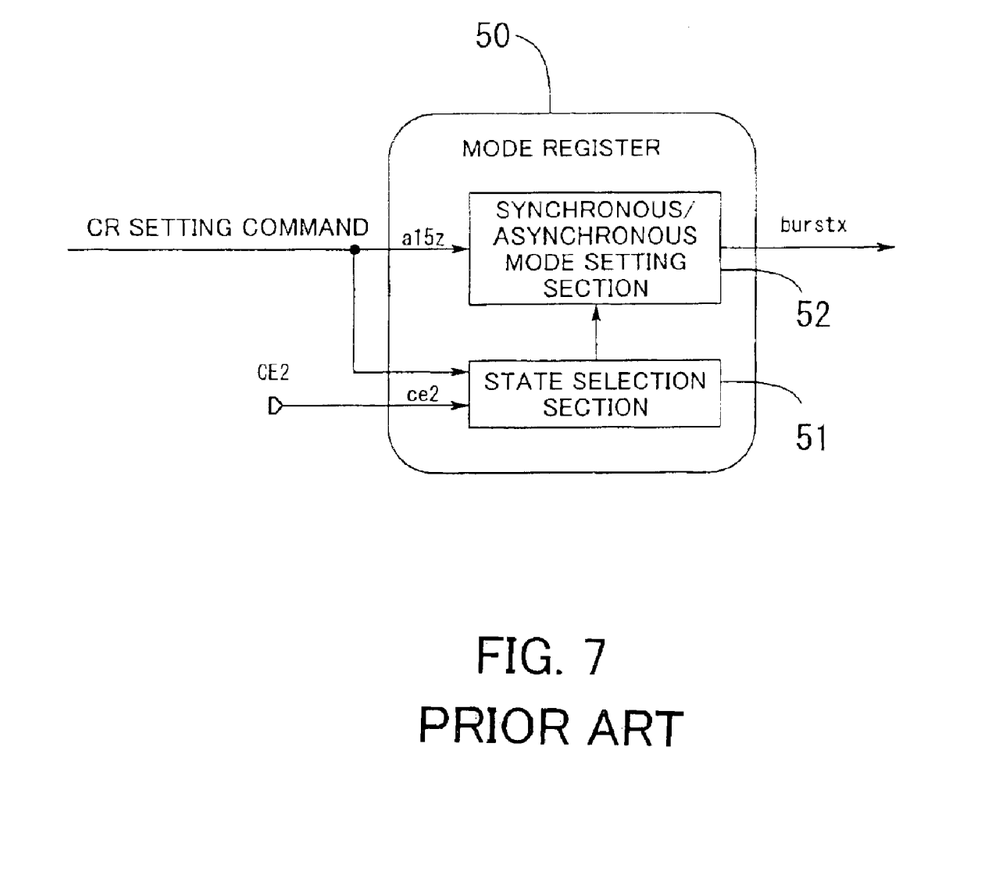
FIG. 7 shows the structure of a mode register which enables the state transitions shown in FIG. 6.

FIG. 7 shows the structure of a mode register which enables the state transitions shown in FIG. 6.

A mode register 50 includes a state selection section 51 and a synchronous/asynchronous mode setting section 52.

The state selection section 51 accepts a CR setting command from a control register (not shown), accepts the transition signal ce2 for selecting a state from the CE2 terminal, and selects the standby state T12 or T15, the power-down state T13 or T16, or the active state, such as read, write, or erase.

In the standby state T12 or T15, the synchronous/asynchronous mode setting section 52 generates a state transition signal burstx for making the transition between the synchronous and asynchronous modes possible on the basis of the signal a15z, being one of the CR setting commands, sent from the control register (not shown) and information indicative of a state selected by the state selection section 51 and sends it to the outside.

Traditionally, the transition to a power-down state has been made only from the asynchronous mode or, as shown in the state transition diagram in FIG. 6, only within the synchronous operation mode or the asynchronous operation mode. That is to say, the transition from a power-down state can be made only within a (synchronous or asynchronous) operation mode set in advance. Accordingly, to make the transition from a power-down state, the state transition signal burstx is generated by the mode register 50 shown in FIG. 7 on the basis of the transition signal ce2 inputted from the CE2 terminal.

SUMMARY OF THE INVENTION

In the present invention a semiconductor memory having a synchronous operation mode or an asynchronous operation mode for an external clock is provided. This semiconductor memory comprises a synchronous/asynchronous mode setting section for generating a signal for causing the semiconductor memory to make the transition between the synchronous operation mode and the asynchronous operation mode and a state selection section for choosing, by selecting an internal signal the level of which changes in a power-down state or an internal signal the level of which does not change in the power-down state in accordance with a state selection signal inputted in advance and passing a signal selected to the synchronous/asynchronous mode setting section, whether the semiconductor memory should make the transition from the power-down state to a standby state in the synchronous mode or a standby state in the asynchronous mode.

The above and other features and advantages of the present invention will become apparent from the following description when taken in conjunction with the accompanying drawings which illustrate preferred embodiments of the present invention by way of example.

DESCRIPTION OF THE PREFERRED EMBODIMENTS

To reconcile a reduction in power consumption by finely setting an operation mode and high-speed data transfer, recently there is a growing demand for the operation of transition from the synchronous mode to the asynchronous mode without setting by a CR, that is to say, Reset to Page for the operation of initializing a chip.

To perform such operation by the conventional mode register 50 shown in FIG. 7, a standby state must be created on the basis of three information signals, that is to say, (1) information for setting the current operation mode and information for setting a (synchronous or asynchronous) operation mode to which the transition from a power-down state is to be made, (2) information inputted from the CE2 terminal, and (3) information indicative of the completion of the transition from the power-down state.

However, this will involve removal of noise at the CE2 terminal by a filter circuit, adjustment of a match between a power-down state selection signal and the state of the CE2 terminal (delaying the transition signal ce2), and the like.

If circuits necessary for taking these measures are located, there will be an increase in current and area.

The present invention was made under the background circumstances described above. An object of the present invention is to provide a semiconductor memory which can make the transition from a power-down state in a synchronous mode to an asynchronous mode without setting by a CR and which needs no extra circuits.

Embodiments of the present invention will now be described in detail with reference to the drawings.

Figure 1:
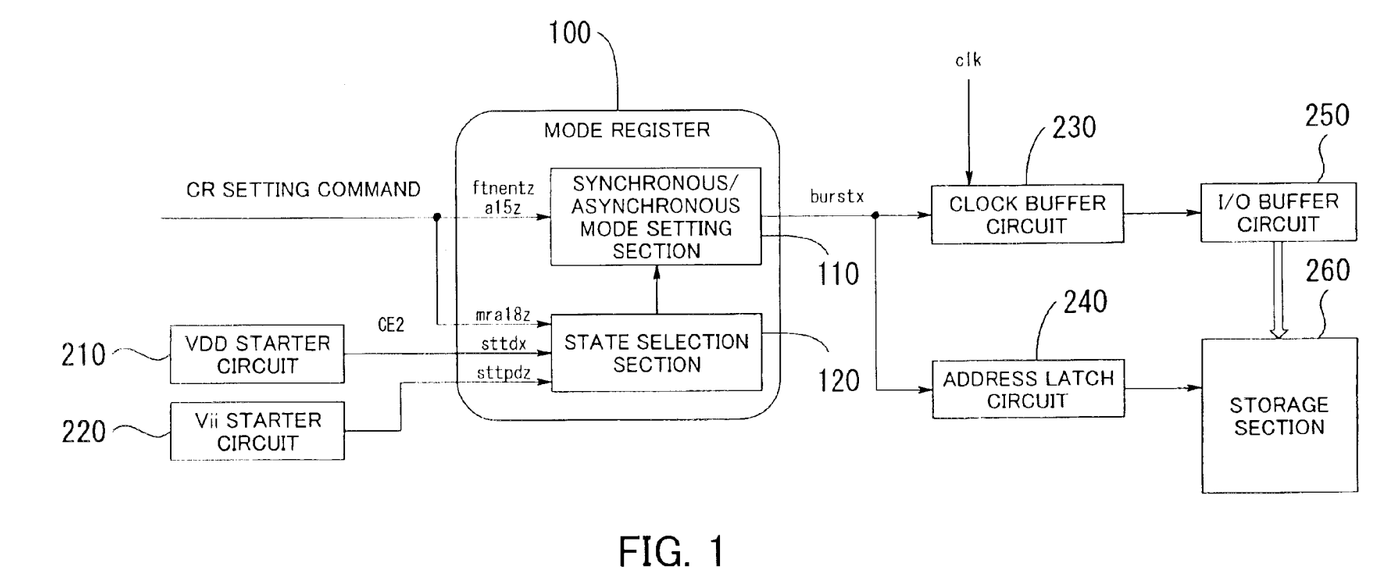
FIG. 1 shows the rough structure of the feature of a semiconductor memory according to an embodiment of the present invention.

FIG. 1 shows the rough structure of the feature of a semiconductor memory according to an embodiment of the present invention.

Figure 2:
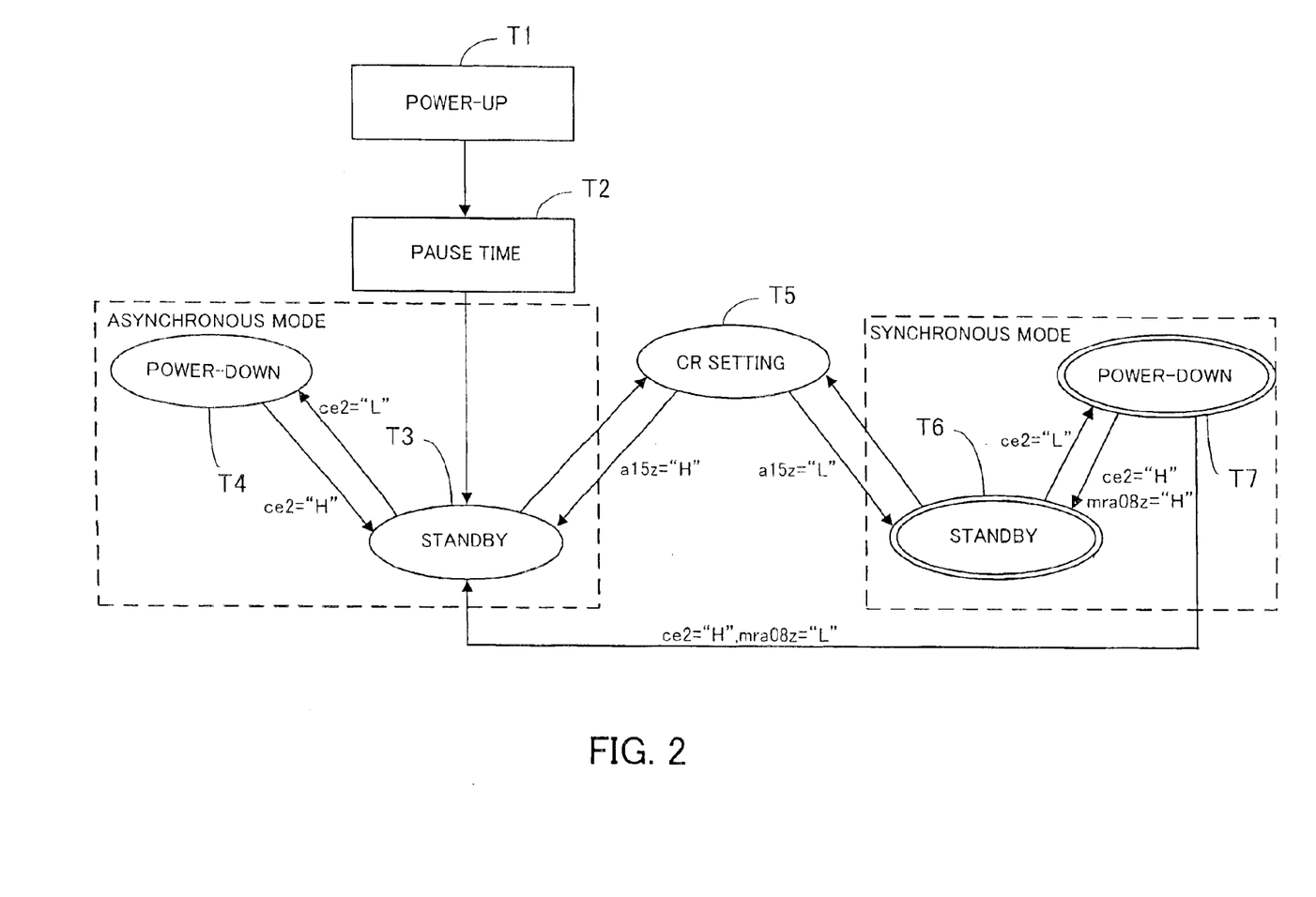
FIG. 2 is a state transition diagram of the semiconductor memory according to the embodiment of the present invention.

FIG. 2 is a state transition diagram of the semiconductor memory according to the embodiment of the present invention.

The semiconductor memory according to the embodiment of the present invention comprises a mode register 100, a VDD starter circuit 210, a Vii starter circuit 220, a clock buffer circuit 230, an address latch circuit 240, an I/O buffer circuit 250, and a storage section 260.

The mode register 100 includes a synchronous/asynchronous mode setting section 110 and a state selection section 120.

The synchronous/asynchronous mode setting section 110 generates a state transition signal burstx for causing the semiconductor memory to make the transition between synchronous and asynchronous modes.

By selecting a starter signal sttpdz for an internal power supply circuit, which is an existing internal signal and the level of which will change in a power-down state T7 in the synchronous mode, or a starter signal sttdx for external power supply, which is an existing internal signal and the level of which will not change in the power-down state T7 in the synchronous mode, on the basis of a state selection signal mra08z inputted in advance and passing it to the synchronous/asynchronous mode setting section 110, the state selection section 120 chooses whether the semiconductor memory should make the transition from the power-down state T7 in the synchronous mode to a standby state T3 in the asynchronous mode or a standby state T6 in the synchronous mode.

The VDD starter circuit 210 is connected to an external power supply terminal (not shown). When external power supply voltage VDD is applied (power-up state T1), the VDD starter circuit 210 generates the starter signal sttdx (at "H" level, for example).

The Vii starter circuit 220 is connected to the internal power supply circuit (not shown), such as a step-up circuit or a step-down circuit, and generates the starter signal sttpdz. The starter signal sttpdz is an internal signal and is at, for example, "L" level in the standby state T3 or T6 in which internal power supply is used or in an active state (not shown) in which synchronous or asynchronous operation, such as read, write, or erase, is performed. The starter signal sttpdz becomes, for example, "H" level in a power-down state T4 or the power-down state T7.

The clock buffer circuit 230 is connected to an external clock terminal (not shown). When the state transition signal burstx indicative that the synchronous mode is selected is inputted, the clock buffer circuit 230 accepts an external clock clk. When the state transition signal burstx indicative that the asynchronous mode is selected is inputted, the clock buffer circuit 230 does not accept the external clock clk. The external clock clk accepted is sent to the I/O buffer circuit 250.

The address latch circuit 240 holds an address inputted from an external address input terminal (not shown) in accordance with an operation mode determined by the state transition signal burstx inputted and selects a memory cell in the storage section 260 corresponding to the address.

In the synchronous mode, the I/O buffer circuit 250 writes data inputted from an external input terminal (not shown) to the storage section 260 or reads data from the storage section 260 in synchronization with the external clock clk.

As is not shown, the storage section 260 includes a memory cell array where memory cells are arranged like a matrix, a row decoder and a column decoder for selecting a memory cell corresponding to an address inputted, a sense amplifier, and a write amplifier.

The operation of the circuits shown in FIG. 1 will now be described in brief with the state transition diagram shown in FIG. 2.

When the external power supply voltage VDD is applied via the external power supply terminal (not shown), the semiconductor memory goes into the power-up state T1. After the elapse of pause time T2, the semiconductor memory goes into the standby state T3 in the asynchronous mode. When a transition signal ce2 inputted from a CE2 terminal (not shown) becomes "L," the semiconductor memory goes into the power-down state T4. When the transition signal ce2 becomes "H" in the power-down state T4, the semiconductor memory returns to the standby state T3.

In the standby state T3 in the asynchronous mode, signals ftnentz and a15z, being CR setting commands, are both at, for example, "H". The state transition signal burstx outputted from the synchronous/asynchronous mode setting section 110 becomes, for example, "H" and is inputted to the clock buffer circuit 230 and the address latch circuit 240.

When the state transition signal burstx at "H" level is inputted to the clock buffer circuit 230, the clock buffer circuit 230 stops accepting the external clock clk. As a result, the address latch circuit 240 and the I/O buffer circuit 250 input data to or output data from the storage section 260 without synchronizing with the external clock clk. In this case, the amount of power consumed is small.

When the signal ftnentz at "H" level and the signal a15z at "L" level are inputted from a control register (not shown) to the synchronous/asynchronous mode setting section 110 in the mode register 100 as CR setting commands in the standby state T3 in the asynchronous mode (control register (CR) setting state T5 to the synchronous mode), the semiconductor memory goes into the standby state T6 in the synchronous mode. At this time the synchronous/asynchronous mode setting section 110 outputs the state transition signal burstx at "L" level to the clock buffer circuit 230 and the address latch circuit 240.

When the state transition signal burstx at "L" level is inputted to the clock buffer circuit 230, the clock buffer circuit 230 accepts the external clock clk and sends it to the I/O buffer circuit 250. As a result, data is inputted to or outputted from the storage section 260 in synchronization with the external clock clk. This increases efficiency in a data transfer.

When the transition signal ce2 becomes "L" level in the standby state T6 in the synchronous mode, the semiconductor memory goes into the power-down state T7.

When the transition signal ce2 becomes "H" level in the power-down state T7, the state selection section 120 in the mode register 100 selects the starter signal sttdx generated by the VDD starter circuit 210 or the starter signal sttpdz, which is generated by the Vii starter circuit 220 and the potential level of which will change in the power-down state T7, on the basis of the state selection signal mra08z inputted in advance and passes it to the synchronous/asynchronous mode setting section 110.

For example, to cause the semiconductor memory to make the transition from the power-down state T7 to the standby state T3 in the asynchronous mode, the starter signal sttpdz should be selected with the state selection signal mra08z set to "L" level as shown in FIG. 2. To cause the semiconductor memory to make the transition from the power-down state T7 to the standby state T6 in the synchronous mode, the starter signal sttdx should be selected with the state selection signal mra08z set to "H" level as shown in FIG. 2.

As stated above, when the semiconductor memory is returned from the power-down state T7 in the synchronous mode to the standby state T3 in the asynchronous mode or the standby state T6 in the synchronous mode, input from the CE2 terminal is not used. As a result, a measure to remove noise at the CE2 terminal is unnecessary. Moreover, by using the existing starter signals sttdx and sttpdz, a match with internal potential will be maintained. Therefore, no extra circuits are needed.

Figure 3:
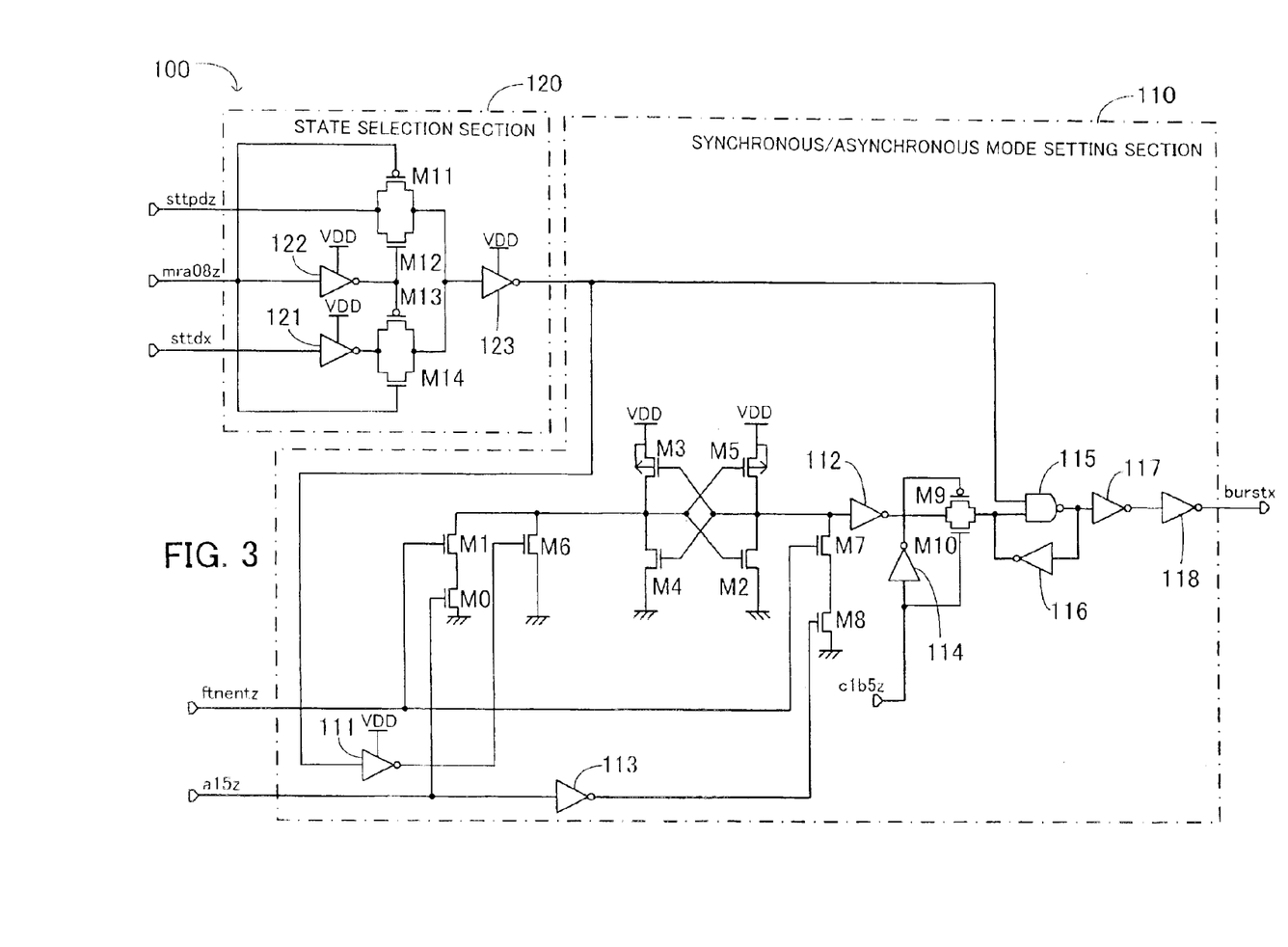
FIG. 3 is a circuit diagram of a mode register according to the embodiment of the present invention.

The mode register 100 will now be described in detail.

FIG. 3 is a circuit diagram of the mode register according to the embodiment of the present invention.

As described above, the mode register 100 according to the embodiment of the present invention includes the synchronous/asynchronous mode setting section 110 and the state selection section 120.

The synchronous/asynchronous mode setting section 110 includes n-channel metal oxide semiconductor field effect transistors (MOSFETs) (hereinafter referred to as nMOS transistors) M0 and M1 connected in series. One input-output terminal of the nMOS transistor M0 is grounded and the other input-output terminal of the nMOS transistor M0 is connected to one input-output terminal of the nMOS transistor M1. The signal a15z is inputted from the control register (not shown) to a gate of the nMOS transistor M0. The signal ftnentz is inputted from the control register (not shown) to a gate of the nMOS transistor M1.

The synchronous/asynchronous mode setting section 110 also includes a latch made up of nMOS transistors M2 and M4 and p-channel MOSFETs (hereinafter referred to as pMOS transistors) M3 and M5. A signal sent from the other input-output terminal of the nMOS transistor M1 is inputted to the latch. The external power supply voltage VDD is applied to the latch.

An nMOS transistor M6 one input-output terminal of which is connected to the latch and the other input-output terminal of the nMOS transistor M1 is included. The other input-output terminal of the nMOS transistor M6 is grounded. A signal sent from the state selection section 120 is inputted to a gate of the nMOS transistor M6 via an inverter 111 driven by the external power supply voltage VDD.

Output from the latch is inputted to an input terminal of an inverter 112.

An nMOS transistor M7 one input-output terminal of which is connected to the output side of the latch and the input terminal of the inverter 112 is included. The other input-output terminal of the nMOS transistor M7 is connected to one input-output terminal of an nMOS transistor M8. The other input-output terminal of the NMOS transistor M8 is grounded. The signal ftnentz is inputted to a gate of the nMOS transistor M7. The signal a15z is inputted to a gate of the nMOS transistor M8 via an inverter 113.

One input-output terminal of a pMOS transistor M9 and one input-output terminal of an nMOS transistor M10 are connected to an output terminal of the inverter 112. The other input-output terminal of the pMOS transistor M9 and the other input-output terminal of the nMOS transistor M10 are connected to one input terminal of a NAND circuit 115. A signal c1b5z is inputted to a gate of the pMOS transistor M9 via an inverter 114 and is inputted directly to a gate of the nMOS transistor M10. The signal c1b5z is inputted from a chip enable terminal /CE1 (not shown and hereinafter referred to as the /CE1 terminal).

A circuit made up of the pMOS transistor M9, the nMOS transistor M10, and the inverter 114 prevents two pieces of data from being sent at the same time in a state in which a latch is established. When the signal c1b5z is at "L" level, output from the inverter 112 is not sent to the NAND circuit 115.

A signal outputted from the state selection section 120 is inputted to the other input terminal of the NAND circuit 115. Output from the NAND circuit 115 is fed back to the one input terminal of the NAND circuit 115 via an inverter 116. The output from the NAND circuit 115 is outputted from the mode register 100 via inverters 117 and 118 as the state transition signal burstx.

On the other hand, the state selection section 120 includes a PMOS transistor M11 to one input-output terminal of which the starter signal sttpdz for the internal power supply circuit is inputted, an nMOS transistor M12 to one input-output terminal of which the starter signal sttpdz for the internal power supply circuit is inputted, a pMOS transistor M13 to one input-output terminal of which the starter signal sttdx for the external power supply is inputted via an inverter 121 driven by the external power supply voltage VDD, and an nMOS transistor M14 to one input-output terminal of which the starter signal sttdx for the external power supply is inputted via the inverter 121 driven by the external power supply voltage VDD.

The state selection signal mra08z is inputted directly to a gate of the pMOS transistor M11 where the starter signal sttpdz for the internal power supply circuit is inputted, and is inputted to a gate of the nMOS transistor M12 where the starter signal sttpdz for the internal power supply circuit is inputted via an inverter 122 driven by the external power supply voltage VDD.

Moreover, the state selection signal mra08z is inputted directly to a gate of the nMOS transistor M14 where the starter signal sttdx for the external power supply is inputted, and is inputted to a gate of the pMOS transistor M13 where the starter signal sttdx for the external power supply is inputted via the inverter 122 driven by the external power supply voltage VDD.

The other input-output terminal of the pMOS transistor M11, the other input-output terminal of the nMOS transistor M12, the other input-output terminal of the pMOS transistor M13, and the other input-output terminal of the nMOS transistor M14 are connected to an input terminal of an inverter 123 driven by the external power supply voltage VDD.

Output from the inverter 123 is outputted from the state selection section 120.

The operation of the mode register 100 will now be described.

To make the state transitions shown in FIG. 2, the semiconductor memory enters the asynchronous mode through the power-up state.

At this time the signal a15z at "H" level and the signal ftnentz at "H" level are inputted. Accordingly, in the latch made up of the pMOS transistors M3 and M5 and the nMOS transistors M2 and M4, output is latched at "L" on the pMOS transistor M3 and nMOS transistor M4 side and output is latched at "H" on the pMOS transistor M5 and NMOS transistor M2 side (the external power supply voltage VDD is used, so a state is held even in the power-down state T4). As a result, output from the NAND circuit 115 is latched at "H". Therefore, the state transition signal burstx becomes "H" and the asynchronous mode is set and maintained even in the power-down state T4.

When the signal a15z becomes "L" level (CR setting state T5 to the synchronous mode), in the latch made up of the pMOS transistors M3 and M5 and the nMOS transistors M2 and M4, output is latched at "H" on the PMOS transistor M3 and NMOS transistor M4 side and output is latched at "L" on the PMOS transistor M5 and nMOS transistor M2 side. As a result, the potential of one input terminal of the NAND circuit 115 becomes "H".

In the state selection section 120, at this time the starter signals sttdx and sttpdz are at "H" and "L" respectively (as described above, the starter signal sttpdz for the internal power supply circuit becomes "H" in the power-down state). Accordingly, the potential of the other input terminal of the NAND circuit 115 becomes "H" regardless of the state of the state selection signal mra08z and the state transition signal burstx becomes "L". As a result, the semiconductor memory enters the synchronous mode.

When the semiconductor memory goes into the power-down state T7 in the synchronous mode, internal power supply voltage goes off. As a result, the starter signal sttpdz becomes "H". At this time the potential level of the other input terminal of the NAND circuit 115 depends on the state of the state selection signal mra08z. That is to say, if the state selection signal mra08z is at "H," then the starter signal sttdx will be selected. The potential of the other input terminal of the NAND circuit 115 remains at "H" and the state transition signal burstx is kept at "L". Therefore, at return time the semiconductor memory makes the transition to the standby state T6 in the synchronous mode.

On the other hand, if the state selection signal mra08z is at "L," then the starter signal sttpdz will be selected. The potential of the other input terminal of the NAND circuit 115 becomes "L" and output from the NAND circuit 115 is latched at "H". Accordingly, the state transition signal burstx becomes "H". As a result, at return time the semiconductor memory makes the transition to the standby state T3 in the asynchronous mode. In addition, by forcedly resetting the above latch made up of the pMOS transistors M3 and M5 and the nMOS transistors M2 and M4 by the use of the nMOS transistor M6, it is returned to a latching state in the asynchronous mode.

When the signal a15z becomes "H" level with the standby state T6 in the synchronous mode (CR setting state T5 to the asynchronous mode), in the latch made up of the pMOS transistors M3 and M5 and the nMOS transistors M2 and M4, output is latched at "L" on the pMOS transistor M3 and nMOS transistor M4 side and output is latched at "H" on the pMOS transistor M5 and nMOS transistor M2 side. As a result, output from the NAND circuit 115 is latched at "H". Therefore, the state transition signal burstx becomes "¹H" and the semiconductor memory enters the asynchronous mode.

Finally, the operation of the semiconductor memory according to the embodiment of the present invention will be summarized with timing charts.

Figure 4:
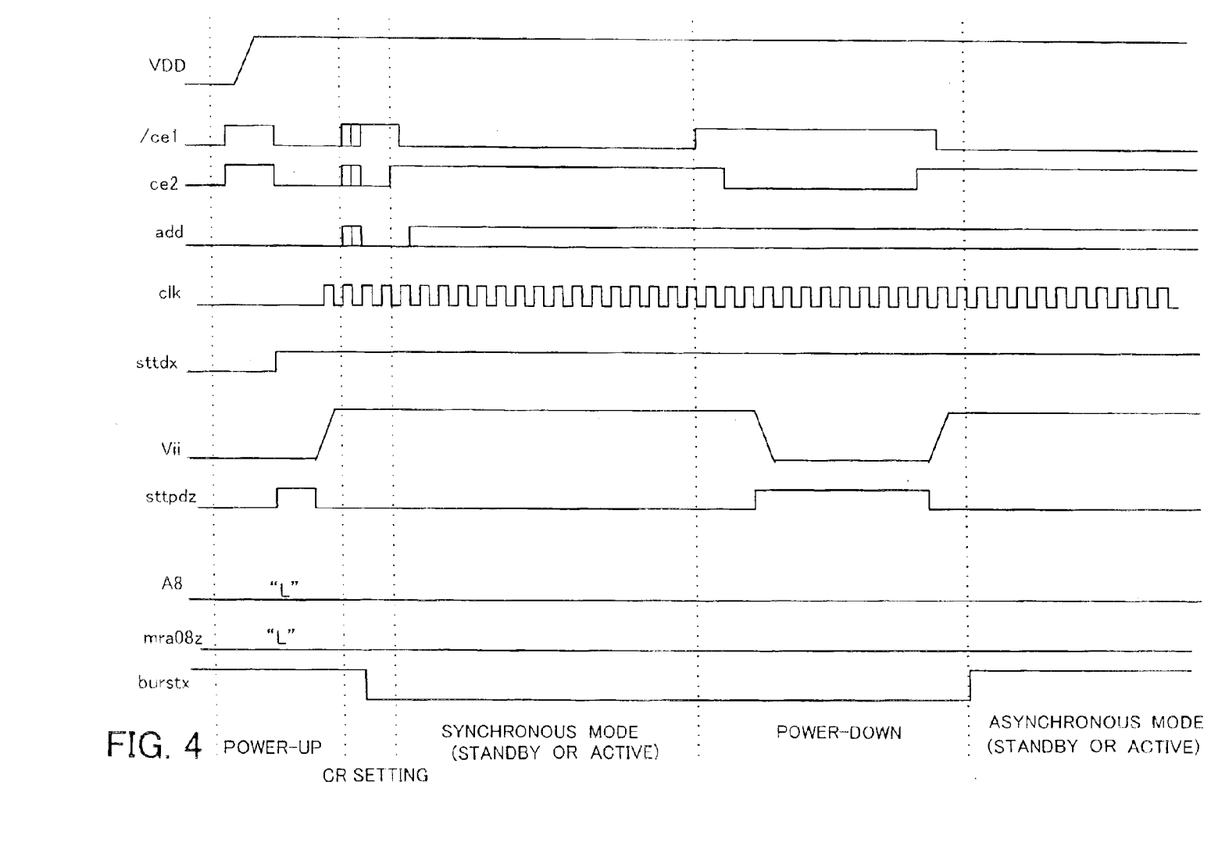
FIG. 4 is a first timing chart for describing the operation of the semiconductor memory according to the embodiment of the present invention.

FIG. 4 is a first timing chart for describing the operation of the semiconductor memory according to the embodiment of the present invention.

Assuming that in FIG. 2 the semiconductor memory goes into the power-up state T1, enters the synchronous mode (the standby state T6 or the active state in which synchronous operation, such as read, write, or erase, is performed) through the CR setting state T5, goes into the power-down state T7, and then makes the transition again to the asynchronous mode (the standby state T3 or the active state in which asynchronous operation, such as read, write, or erase, is performed), relationships among the signals are shown.

A signal /ce1 corresponds to the signal c1$b$5$z$ inputted to the mode register 100 shown in FIG. 3. A signal add is an address.

The signal /ce1 inputted from the /CE1 terminal (not shown) and the transition signal ce2 inputted from the CE2 terminal are at "H" level for a predetermined period of time, the external power supply voltage VDD is applied, and the semiconductor memory goes into the power-up state T1. Then the starter signal sttdx for the external power supply becomes "H" level and the starter signal sttpdz for the internal power supply circuit also becomes "H" level and remains at "H" level for a predetermined period of time. Moreover, the internal power supply starts. The semiconductor memory enters the asynchronous mode after the power-up state T1, so the state transition signal burstx is at "H" level.

It is assumed that at this time the signal a15$z$ at "L" level, for example, is inputted from an external address terminal A15 (not shown) as a CR setting command. Then the CR setting state T5 to the synchronous mode arises. The state transition signal burstx becomes "L" and the semiconductor memory enters the synchronous mode. In the synchronous mode, data is read or written in synchronization with the external clock clk. At this time the signal /ce1 and the transition signal ce2 are "L" and "H" respectively.

When the signal /ce1 rises to "H" and the transition signal ce2 becomes "L," the semiconductor memory goes into the power-down state T7. At this time the internal power supply voltage Vii falls and the starter signal sttpdz becomes "H". The application of the external power supply voltage VDD is not stopped, so the starter signal sttdx remains at "H" and does not change.

When the transition signal ce2 rises and the return of the semiconductor memory from the power-down state T7 begins, the internal power supply voltage Vii rises and the application of the internal power supply voltage Vii resumes. The starter signal sttpdz becomes "L". The signal /ce1 falls. At this time the state selection signal mra08$z$, being a CR setting command, has been made "L" by, for example, a signal A8 inputted in advance from the address terminal (not shown). Accordingly, as described above, the starter signal sttpdz the level of which will change is selected, the state transition signal burstx rises to "H," and the semiconductor memory enters the asynchronous mode.

Figure 5:
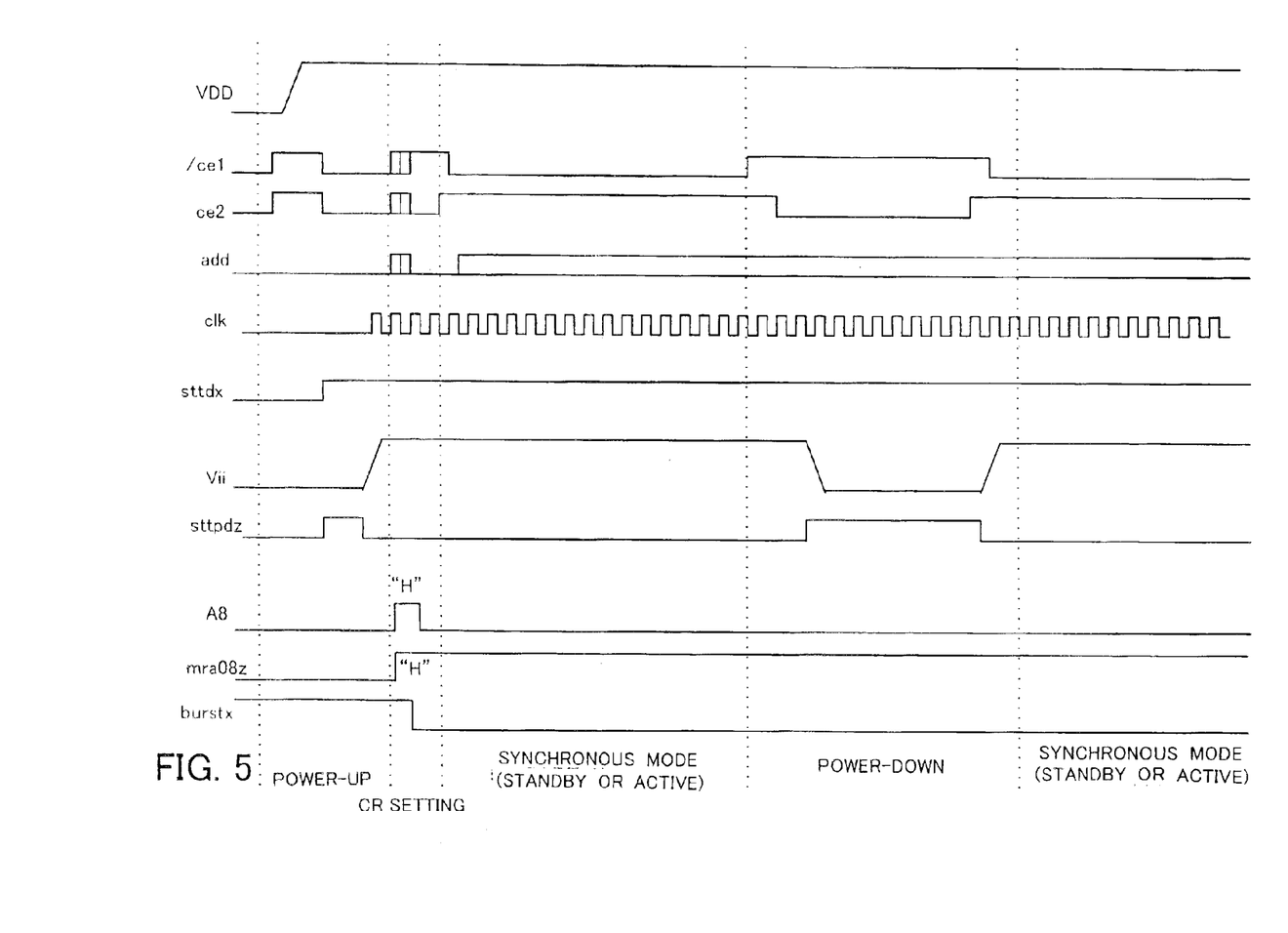
FIG. 5 is a second timing chart for describing the operation of the semiconductor memory according to the embodiment of the present invention.

FIG. 5 is a second timing chart for describing the operation of the semiconductor memory according to the embodiment of the present invention.

Assuming that in FIG. 2 the semiconductor memory goes into the power-up state T1, enters the synchronous mode (the standby state T6 or the active state in which synchronous operation, such as read, write, or erase, is performed) through the CR setting state T5, goes into the power-down state T7, and then returns to the synchronous mode, relationships among the signals are shown.

In the power-down state T7 in the synchronous mode, when the transition signal ce2 rises and the return of the semiconductor memory from the power-down state T7 begins, the internal power supply voltage Vii rises and the application of the internal power supply voltage Vii resumes.

The starter signal sttpdz becomes "L". The signal /ce1 falls. At this time the state selection signal mra08$z$, being a CR setting command, has been made "H" by, for example, the signal A8 inputted in advance from the address terminal (not shown). Accordingly, as described above, the starter signal sttdx the level of which will not change is selected, the state transition signal burstx remains at "L," and the semiconductor memory returns to the synchronous mode.

As stated above, the semiconductor memory can easily make the transition from the power-down state T7 in the synchronous mode to the standby state T3 in the asynchronous mode by the use of the existing internal signals without going through the CR setting state T5. Similarly, the semiconductor memory can make the transition from the power-down state T4 in the asynchronous mode to the standby state T3 in the synchronous mode without going through the CR setting state T5.

With the semiconductor memory according to the present invention, whether it should return from the power-down state to the standby state in the synchronous mode or the standby state in the asynchronous mode is determined by selecting the existing internal signal the level of which changes in the power-down state or the existing internal signal the level of which does not change in the power-down state on the basis of the state selection signal. Therefore, a match with internal potential is maintained and there is no need to add extra circuits.

The present invention is applicable to, for example, portable devices using a DRAM.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory having a synchronous operation mode or an asynchronous operation mode for an external clock, the memory comprising:

a synchronous/asynchronous mode setting section for generating a signal for causing the semiconductor memory to make a transition between the synchronous operation mode and the asynchronous operation mode; and a state selection section for choosing, by selecting an internal signal the level of which changes in a power-down state or an internal signal the level of which does not change in the power-down state in accordance with a state selection signal inputted in advance and passing a signal selected to the synchronous/asynchronous mode setting section, whether the semiconductor memory should make a transition from the power-down state to a standby state in the synchronous mode or a standby state in the asynchronous mode.

2. The semiconductor memory according to claim 1, wherein the internal signal the level of which changes in the power-down state is a starter signal for an internal power supply circuit.

3. The semiconductor memory according to claim 1, wherein the internal signal the level of which does not change in the power-down state is a starter signal for an external power supply.

4. The semiconductor memory according to claim 1, wherein instructions to select the internal signal the level of which changes in the power-down state are given by the state selection signal to cause the semiconductor memory to make the transition from the power-down state to the standby state in the asynchronous mode.

5. The semiconductor memory according to claim 1, wherein the internal signal the level of which does not change in the power-down state is generated at power-up time.

6. The semiconductor memory according to claim 1, further comprising an external clock buffer, wherein:
   the signal for causing the semiconductor memory to make the transition between the synchronous operation mode and the asynchronous operation mode is inputted to the external clock buffer; and
   the external clock buffer stops accepting the external clock in the asynchronous operation mode.

* * * * *